United States Patent [19]

Rohrer et al.

[11] Patent Number: 4,851,806

[45] Date of Patent: Jul. 25, 1989

[54] FUSE DEVICE AND METHOD OF MANUFACTURING SUCH FUSE DEVICE

[75] Inventors: Heinrich Rohrer, Sachseln; Werner Staubli, Kriens, both of Switzerland

[73] Assignee: Schurter AG, Lucerne, Switzerland

[21] Appl. No.: 264,080

[22] Filed: Oct. 24, 1988

[30] Foreign Application Priority Data

Nov. 3, 1987 [CH] Switzerland .................. 04289/87

[51] Int. Cl.[4] .................. H01H 85/14; H01H 85/16
[52] U.S. Cl. .................. 337/231; 337/234; 337/252; 29/623
[58] Field of Search .............. 337/228, 231, 234, 201, 337/251, 252, 213, 214, 216; 29/623

[56] References Cited

U.S. PATENT DOCUMENTS 4,532,489  7/1985  Phillips .................. 337/252
4,720,695  1/1988  Urani et al. .................. 337/252

*Primary Examiner*—H. Broome
*Attorney, Agent, or Firm*—Werner W. Kleeman

[57] ABSTRACT

Within an electrically insulating housing there is provided a continuous hollow space open at both ends. Tubular portions of end contacts are insertably disposed at both ends of the hollow space. Flat portions of the end contacts form clamping locations for a fusible conductor and also solder legs. At the clamping locations there are clamped the ends of the fusible conductor. Each of the solder legs form an associated wave soldering region and a reflow soldering region. During fabrication of the fuse device the end contacts which then still possess a tubular-shaped configuration are inserted into the ends of the hollow space of the electrically insulating housing. There is then drawn-in the fusible conductor and predetermined portions of each of the end contacts are pressed flat for form the flat portions. In this way, the ends of the fusible conductor are clamped at the clamping locations. Thereafter, the flat portions are bent to form the solder legs. The fuse device can be completely automatically fabricated and completely automatically used. The fuse device possesses extremely great operability with smallest dimensions thereof.

12 Claims, 3 Drawing Sheets

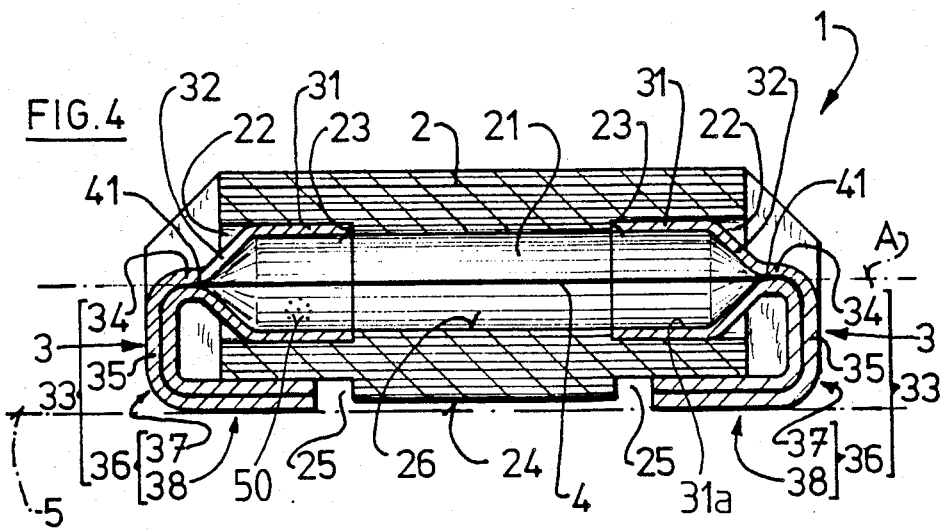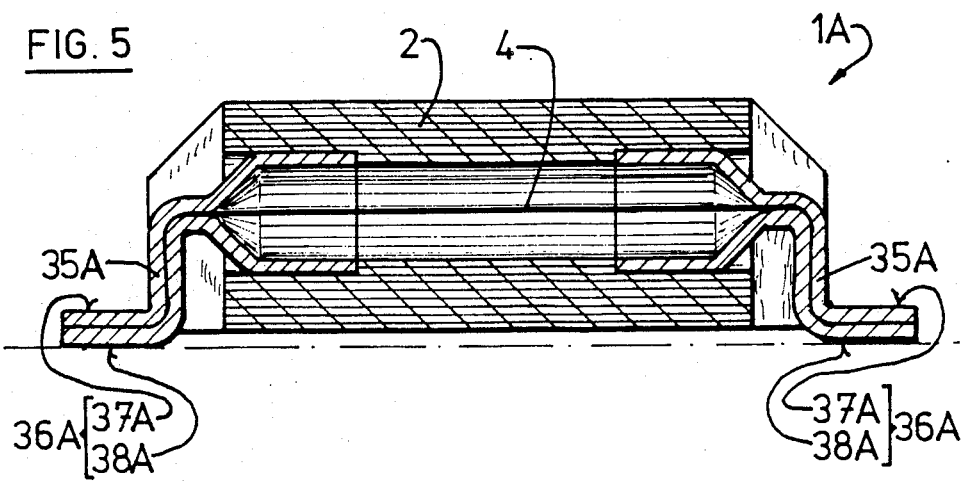

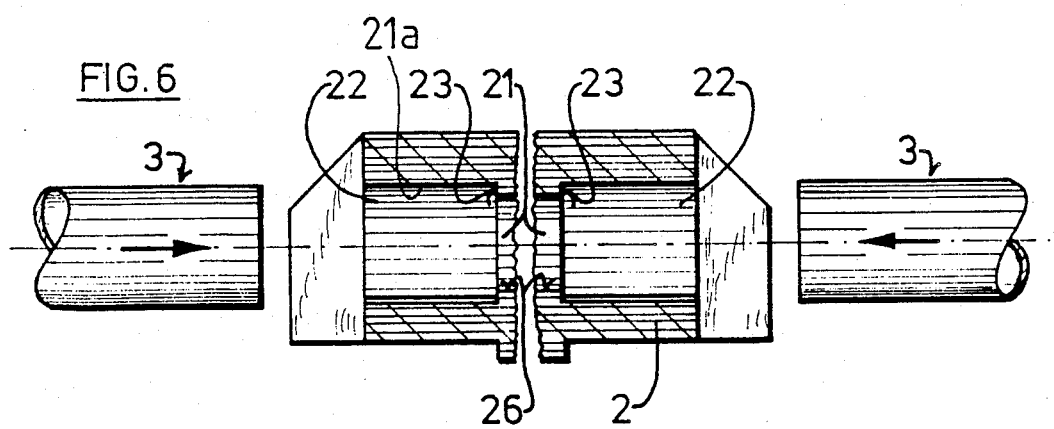
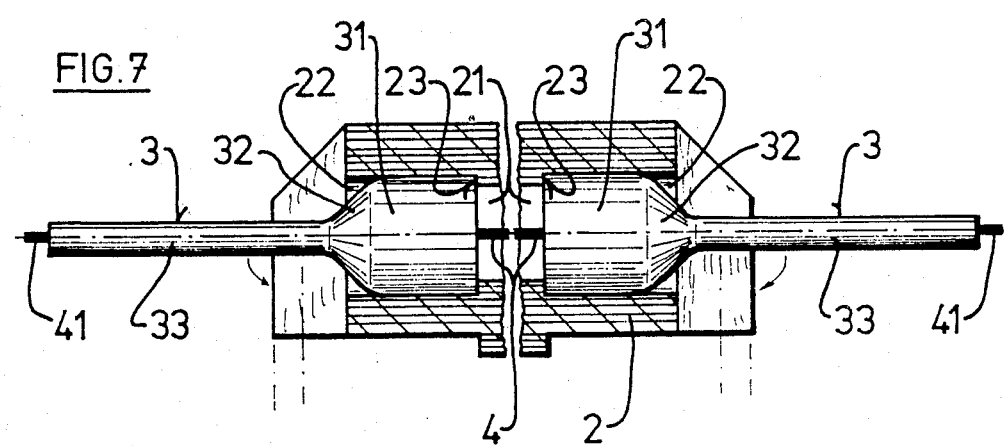

4,851,806

FUSE DEVICE AND METHOD OF MANUFACTURING SUCH FUSE DEVICE

BACKGROUND OF THE INVENTION

The present invention relates to a new and improved construction of a fuse device or fuse and to an improved method of fabricating or manufacturing such fuse device or fuse.

Generally speaking, the fuse device of the present development is of the type comprising an electrically insulating housing or housing member in which there is provided a hollow space or cavity continuously extending along a lengthwise axis. This continuously extending hollow space or cavity is open at both opposite ends or end regions thereof. There are also provided two electrically conductive end contacts connected with the electrically insulating housing and located at the region of the open ends of the hollow space or cavity. Additionally, the fuse device contains a fusible conductor, such as a fusible wire or the like, which extends concentrically with respect to the aforementioned lengthwise axis of the hollow space or cavity and within such hollow space or cavity. The fusible conductor is electrically conductively connected at each of its both ends or end portions at a respective clamping location with an associated one of the two end contacts.

Such type of fuse devices are known in this technology and are predominantly used as fuse inserts, also referred to as fusible inserts. Numerous constructions of such fuse elements have been proposed. Certain constructions of such fuse elements even possess dimensions, nonetheless such miniature fuse elements are exceedingly small still not capable of being employed in a practical fashion as what is referred to in the art as SMD-fuse devices or elements, wherein "SMD" means "Surface Mounted Device".

There are available a considerable number of publications concerning so-called "surface mounting techniques" or "surface mounted technology", herein sometimes briefly designated "SMT", and also the aforementioned "surface mounted devices" or "SMD". When employing surface mounted technology (SMT), the connection legs or leg members, also referred to in the art as "pins" of the surface mounted device (SMD) is soldered at a soldering or solder region or zone, also referred to as a "pad", in accordance with the reflow soldering process or in accordance with the wave soldering process.

SUMMARY OF THE INVENTION

Therefore with the foregoing in mind it is a primary object of the present invention to provide a new and improved construction of a fuse device which is suitable as a SMD for SMT, wherein apart from possessing small dimensions and being suitable for both mentioned soldering process and possessing high operational integrity or security, also can be economically fabricated.

A further important object of the present invention is concerned with a new and improved construction of a fuse device and a method of fabricating the same which allows for completely automatic production of the fuse device and also affords automatic connection of such fuse device with printed circuit boards or prints or the like.

Yet a further significant object of the present invention is concerned with an improved construction of fuse device which is relatively small in size, exceedingly reliable in operation, can be economically fabricated, and particularly in an automated fashion.

Now in order to implement these and still further objects of the invention, which will become more readily apparent as the description proceeds, the fuse device of the present development, among other things, is manifested by the features that the fuse device constitutes a surface mounted device. Each of both end contacts engages by means of a corresponding tubular or tube-shaped portion into the interior of the associated end of the hollow space or cavity of the housing. Each tubular portion has formed or provided thereat a flat or flattened portion which, on the one hand, forms an associated clamping location for the fusible conductor and, on the other hand, forms an associated connection leg or pin, specifically a soldering or solder leg or pin. Additionally, both of the solder legs or pins extend towards the same side of the lengthwise axis of the hollow space or cavity of the housing.

Regarding the heretofore considered prior art constructions of fuse devices, it is to be first of all explained that as concerns the connection of an end or end portion of the fusible conductor with the associated end contact there are known in this technology essentially the following constructions of fuse devices. As a general rule, the housing is constituted by an electrically insulating tube or tubular member and, likewise as a general rule, the end contacts or terminals are constituted by caps or cap members. These caps are externally seated upon the electrically insulating tube members of the housing. The following comments are specifically made with reference to the state of the art fuse devices:

(a) The end of the fusible conductor which is guided through a hole or opening of the associated cap is connected with such cap by a so-called external solder location. The soldering operation must be accomplished with sufficient input of thermal energy in order to ensure for good contact. Yet, too much thermal energy input can result in undesired alterations of the fusible conductor, for instance alloys forming the same. Since the aggressive flux or fluxing agents which are required for soldering of fusible conductors formed of resistance materials, cannot be removed from the finished fuse insert constituting the fuse device, there exists the notable danger that faulty fuse devices will be fabricated due to corrosion by the residues of the flux agents. Therefore, at least as concerns fabrication, such type of fuse inserts employing fusible conductors formed of resistance materials are quite problematic to fabricate. Also for these reasons, limitations are placed upon automating the fabrication of such fuse devices, and the soldering operation which must be manually performed leads to high production costs.

(b) The end of the fuse insert located between the insulating tube member and the cap constructed as an end contact or terminal, is connected internally of the fuse insert by a so-called internal soldering or solder location with the base of the cap. The quantity of thermal energy which is required to perfect a good internal soldering location is difficult to control when there is desired a positive fusing or melting of the tin component which is applied to the interior of the cap, yet there should not arise any overheating of the internal soldering location because otherwise there could arise undesired alterations, for instance in the alloy. The flux agent can deposit about the fusible conductor so as to form undesired insulating regions and/or can act in a corrosive manner. Particularly in the case of the previously discussed aggressive flux or fluxing agents for fusible conductors formed of an electrical resistance material such can result in having to completely forego the use of such fusible conductors. The unavoidable contact of the fusible conductor with the insulating tube member and the inclined disposition of the fusible conductor in the insulating tube member can result in unforeseen deviations in the fuse construction. Additionally, the soldering operation cannot be carried out without problem.

(c) The end of the fusible conductor is retained between the cap and the insulating tubular or tube member by purely a clamping action. The clamping forces can markedly deviate, for instance because of the tolerances of the diameter of the insulating tubular or tube member. These clamping forces have to be applied while taking into account the strength of the insulating tubular or tube member. Moreover, it is possible to overly elongate or even rupture the fusible conductor through the application of tensile forces when pressing-on the cap. Also in this case the unavoidable contact of the fusible conductor with the insulating tube member results in further uncertainty in fabrication.

(d) In Swiss Patent No. 566,641, granted July 31, 1975, and which discloses a fuse device of the general type discussed at the outset of this disclosure, the aforementioned drawbacks were attempted to be avoided in that each end of the fusible conductor was clamped centrally of the insulating tube member within the latter between two approximately diametric tabs or flaps arranged in the associated cap or cap member. This fuse device, used for protecting equipment or apparatuses, affords a relatively free selection of the fuse insert and avoids the drawbacks of the aforementioned three types of fuse inserts. However, problems did arise in practice which unexpectedly were antagonistic or in opposition to cost and time-saving fabrication. Also the requirement of having to close the cap end which is open if, as usual, there was desired to use a filler in the fuse insert comprising a granular arc-extinguishing medium or material, was found to be disadvantageous.

Hence, the aforementioned prior art constructions of fuse devices or elements are unsuitable for SMT and also for realization of automatic fabrication.

On the other hand, by virtue of the inventive construction of fuse device and as proposed with the present development, it is possible to use such fuse device in surface mounted technology (SMT) and the fabrication of the fuse device itself can be completely automated.

The housing or housing member of the inventive fuse device can be simply and automatically fabricated by using injection molding technology for plastics materials and with the usual precision of such injection molding of plastics. If desired, the small tubes or tubular members can already be injected molded at the housing. If it is, however, not desired to injection mold the small tubular members or tubes since such is associated with a certain technological and cost expenditure, it is possible to merely initially produce the housing or housing member and then at a later or other suitable time utilize equipment for the assembly of the fuse device.

At such assembly equipment or apparatus it is then possible to insert into each end of the hollow space or cavity of the housing the associated tube or tubular member, Then to automatically draw-in or otherwise insert the fusible conductor, typically the fusible wire, and to flatten the tubular members or tubes in order to clamp the same about the fusible conductor. The thus obtained flat portions or sections then can be automatically bent or flexed to form the connection legs or leg members, specifically the solder or soldering legs or pins.

The thus obtained fuse devices or elements, packaged in tapes, blister packs or other suitable storage packages or magazines and the like, then can be delivered to assembly devices for fabrication of prints or printed circuit boards and at which there can be automatically mounted such fuse devices.

The aforementioned flat or flattened portions or sections of the tube or tubular members are preferably arranged externally of the housing and each preferably possess a portion or section which extends in the lengthwise direction of the hollow space or cavity and which neighbors the associated tube or tubular portion of each end contact.

By appropriately holding the tube or tubular portion it is possible to avoid undesired deformation of such tube or tubular portion when pressing flat or flattening the tube or tubular member to form the flat or flattened portions. Such undesired deformations could have a disadvantageous effect upon the connection with the housing.

The tube or tubular portions and the flat portions sealingly close off the hollow space or cavity against undesired spilling-out of an arc-extinguishing granular material. Hence, the fuse device of the present development, according to a first construction thereof, can be sealingly constructed in relation to an arc-extinguishing granular material, such as for example quartz sand, located therein without the need to undertake any special measures to accomplish this result. The filling of the arc-extinguishing granular material can be accomplished through a lateral or filling opening of the housing into such housing which has already been provided with the end contacts or terminals and the fusible conductor. As a result, such arc-extinguishing granular material cannot reach the clamping locations. Thereafter, the just-mentioned lateral or filling opening of the housing can be closed.

Advantageously, each flat portion or section, especially at the region of the associated clamping location, extends along a certain, usually a small path, axially away from the tube or tubular portion before such flat portion extends in flexed manner and is bent away from the lengthwise axis of the hollow space or cavity. It is then possible, for instance up to such bend location or portion, to fixedly retain the end contact during the bending or flexing operation so that the bending forces are not transmitted to the tube or tubuler portion or section which is plugged or inserted into the housing.

The manner of forming and constructing the soldering or solder legs or pins from the two flat portions or sections is practically unlimited, although there are preferred two forms or shapes of the solder legs or pins which have proven themselves in practice. One of them is the so-called Z-shaped solder leg or pin and the other is the so-to-speak C-shaped solder pin or leg. In the case of the C-shaped configuration of the solder pins or legs it is possible by virtue of the magnitude of the bending radii to realize a more or less pronounced spring behavior and/or a certain dilatation compensation. Both shapes of the solder legs or pins are suitable for both solder or soldering techniques previously discussed.

As indicated previously the invention is not only concerned with a new and improved construction of fuse device or element, but also pertains to a method of fabricating such fuse device or element. This fabrication or manufacturing method, can be performed, for instance, in that there is produced the housing and two tube or tubular members. Each of these tube members or tubes extend at their tube portion or section into an associated end of the two ends of the hollow space or cavity and coaxially with respect to the lengthwise axis of such hollow space or cavity. A suitable fusible conductor is drawn into the hollow space or cavity and into the tubular members or tubes and by pressing flat or flattening a portion of each tubular member or tube there are formed both of the flat or flattened portions. Each respective one of the ends of the fusible conductor is clamped at an associated clamping location and at least a portion of the flat or flattened portion of each of both tubular members or tubes is bent out of or away from the lengthwise axis of the hollow space or cavity and in this way there are formed the connection portions or legs, specifically the solder or soldering legs or pins.

It is further remarked that in both ends of the hollow space or cavity there can be inserted a respective tube or tubular portion of an associated tubular member or tube and disposed coaxially with respect to the lengthwise axis of the hollow space or cavity and then the previously described method steps can be performed.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have been generally used the same reference characters to denote the same or analogous components and wherein:

FIG. 4 is a longitudinal sectional view of the fuse device depicted in FIG. 1, taken substantially along the line IV—IV thereof, wherein there has been omitted any detailed showing of the arc-extinguishing agent or material in order to enhance the portrayal and to simplify the illustration;

FIG. 5 is a longitudinal sectional view, similar to the showing of FIG. 4, of a second exemplary embodiment of a fuse device or element which differs from the first exemplary embodiment depicted in FIGS. 1 to 4 in that here there is a different form or shape of the solder legs or pins;

FIG. 6 is a partially broken and partially sectional view in exploded illustration of the housing and the end contacts which are still of tubular-shape prior to assembly into the housing of the fuse device according to the first exemplary embodiment depicted in FIGS. 1 to 4; and FIG. 7 illustrates a partially broken and partially sectional view of the fuse device or element of the embodiment of FIGS. 1 to 4 prior to bending the flat portions or sections of the tubular members or tubes.

DETAILED DESCRIPTION OF THE PREFERRED EMBODIMENTS

Describing now the drawings, it is to be understood that to simplify the showing thereof, only enough of the construction of the different embodiments of fuse device or fuse element of the present development has been illustrated therein as is needed to enable one skilled in the art to readily understand the underlying principles and concepts of this invention.

Figure 1:
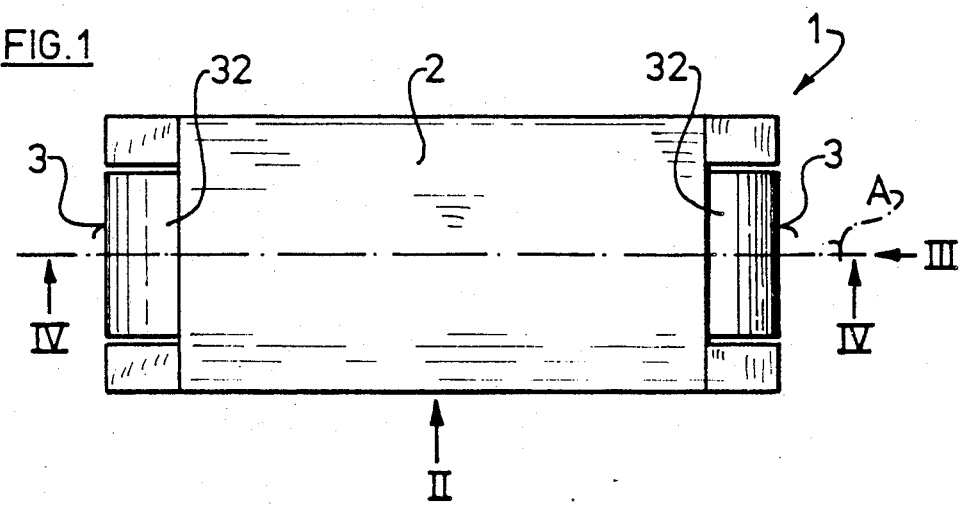
FIG. 1 is an enlarged top plan view depicting a first exemplary embodiment of fuse device or element constructed in SMD-technology.
Figure 2:
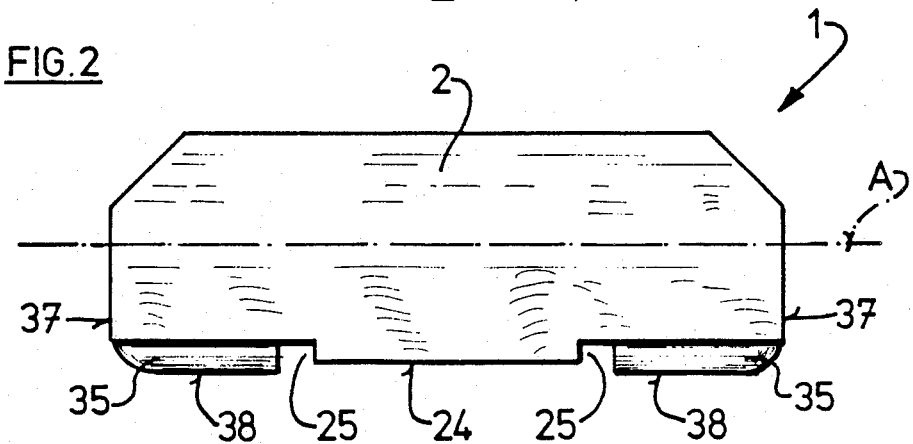
FIG. 2 is a side view of the fuse device depicted in FIG. 1, looking generally in the direction of the arrow II thereof.
Figure 3:
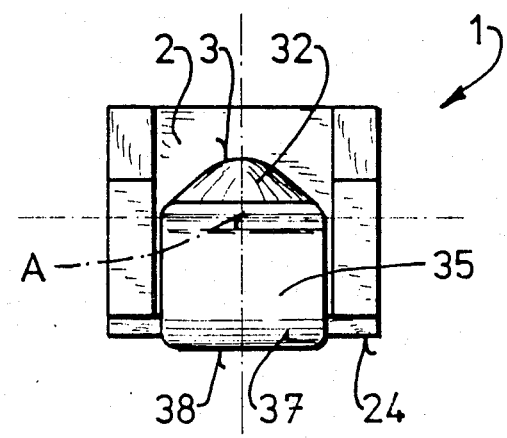
FIG. 3 is an end view of the fuse device depicted in FIG. 1, looking generally in the direction of the arrow III thereof.

Turning attention now specifically to the first exemplary embodiment of fuse device 1, constructed as a surface mounted device (SMD), as depicted in FIGS. 1 to 4, it will be seen that such fuse device 1 comprises a housing or housing member 2 which extends along a predetermined lengthwise axis A. This housing 2 is formed of a suitable electrical insulating material, such as for instance a plastics material, ceramic or the like.

Internally of the housing 2 there extends along the lengthwise axis A a continuous hollow space or cavity 21. This hollow space or cavity 21 which is located within the housing or housing member 2 and has a lengthwise axis here shown to be coincident with the lengthwise axis A of the housing 2 can be filled with a suitable granular arc-extinguishing material, for instance quartz sand, as merely generally illustrated partially at the left side of FIG. 4 and indicated by reference numeral 50. This filler or filled material 50 has not been further depicted in the drawings, in order to simplify the illustration, particularly since any detailed representation thereof is wholly unnecessary for understanding the invention.

In each of both ends or end portions 22 of the hollow space or cavity 21, there is shown inserted a metal or metallic end contact or terminal portion 3. Both of the end contacts or contact means 3 are electrically conductively connected with one another by a fusible conductor or conductor means 4 which is dispositioned along the lengthwise axis A of the housing 2 and the hollow space 21. Each of these two end contacts 3 is fixedly seated in the associated end or end portion 22 of the hollow space 21 at its related tube or tubular portion or section 31. The attachment can be accomplished in any suitable known optional manner, for instance by adhesive bonding, clamping, spraying and so forth.

The tubular portion or section 31 of each metallic end contact 3 gradually merges at the transition portion or section 32 into a flat or flattened portion or section 33. Each such flat or flattened portion 33 comprises a related clamping location or zone 34 and the connection or attachment leg, here specifically shown as solder or soldering legs or pins 35. It will be seen that the clamping location or zone 34 of each end contact 3 is shown located along the lengthwise axis A of the hollow space or cavity 21, whereas the solder legs or pins 35 are shown to be bent or flexed out of or away from this lengthwise axis A.

As will be clearly recognized by referring to FIGS. 6 and 7, each of both end contacts 3, during the fabrication of the fuse device or element 1, extends in the direction of the lengthwise axis A externally of the hollow space or cavity 21 and is readily accessible for application of any suitable tool thereat, such as a gripper device (not shown) for squeezing or flattening desired portions of the end contacts 3.

Reverting now again to FIG. 4, it will be recognized that there has been depicted therein each of the two clamping locations or zones 34 in the squeezed or pressed together state in which each such clamping location 34 both mechanically retains the associated end or end region 41 of the fusible conductor 4 or the like and also electrically conductively interconnects the end contacts 3 with one another by such fusible conductor 4.

The tubular portions or sections 31 flushly bear at the shoulders or shoulder regions 23 formed at the bounding wall 21a of the hollow space or cavity 21 within the housing 2. Consequently, these tubular portions or sections 31 have the inner walls or surfaces 31a thereof in flush alignment with respect to the central or intermediate region 26 of the hollow space or cavity 21 which, in turn, appreciably facilitates the drawing-in or insertion of the fusible conductor 4 during the course of fabrication of the fuse device 1. Furthermore, it will be observed that each flat portion or section 33 is formed following the related clamping location or zone 34 so as to provide the associated solder leg or pin 34.

Continuing, it will be recognized that each solder leg or pin 34 is first bent at approximately right angles with respect to and away from the lengthwise axis A of the hollow space 21 in the direction of the underside 24 of the housing or housing member 2, in order to form at the bent region the wave solder region 37 and then each such solder leg or pin 34 is bent so as to extend substantially parallel to the lengthwise axis A and to extend into an associated recess or depression 25 provided at the underside or bottom 23 of the housing 2 in order to form a reflow solder region 38. It is also to be observed that both of the regions 37 and 38, in other words the wave solder region 37 and the reflow solder region 38 collectively form a solder portion or section 36 of the related solder leg or pin 35.

By virtue of the provision of the recesses or depressions 25 there is ensured that the reflow solder regions or zones 38 are protected in the housing 2, but protrude to such an extent beyond the housing underside or base 24 that these reflow solder regions 38 possess a certain spacing in relation to a printed circuit board or print 5, indicated in FIG. 4 by a chain-dot or phantom line, in order to afford adequate space for a suitable bonding agent, such as an adhesive.

Now in contrast to the first exemplary embodiment of fuse device 1 heretofore described with reference to FIGS. 1 to 4, 6 and 7, the second exemplary embodiment of fuse device or element 1A depicted in FIG. 5, again constructed as a surface mounted device (SMD), differs therefrom basically only due to the provision of a different configuration or shape of the solder legs or pins 35A, the solder portions or sections 36A of which are outwardly bent away in each instance from the associated housing or housing member 2 and at that location form the related wave solder region 37A and the reflow solder region 38A. It is for this reason that in FIG. 5 only the just mentioned reference characters have been specifically indicated, since it will be apparent that in all other respects the modified construction of fuse device or element 1A of FIG. 5 corresponds to the fuse device 1 described heretofore with reference to FIGS. 1 to 4, 6 and 7. The explained difference between the two fuse constructions may be observed in terms of the fuse device 1 of the embodiment of FIGS. 1 to 4, 6 and 7 having the solder legs or pins 35 bent in a substantially C-shaped configuration, whereas the corresponding solder legs or pins 35A of the embodiment of FIG. 5 are bent in a substantially Z-shaped configuration.

Turning attention now again to FIGS. 6 and 7 it is to be understood that there has been depicted therein rather schematically the more important components of the fuse device in order to explain fabrication of the first exemplary embodiment of fuse device 1 as depicted in FIGS. 1 to 4, although the discussion is also relevant for the modified embodiment of FIG. 5.

Firstly, it will be seen that the housing or housing member 2 extends along the lengthwise axis A and along which there coaxially extends the hollow space or cavity 21. From each end or end region of the housing 2 there is inserted along the bounding wall 21a of the hollow space or cavity 21, which provides a clamping seat, the end contacts 3 which are still in the form of small tubes or tubular members. These substantially tube-shaped or tubular end contacts 3 are displaced along the lengthwise axis A of the housing 2 and hollow space 21 until they bear at the related shoulder 23 near each associated end or end region 22 of such hollow space or cavity 21. Then there is drawn-in or otherwise appropriately inserted the fusible conductor 4 through the two thus mounted end contacts 3 and through the hollow space or cavity 21. The end regions or ends 41 of the fusible conductor 4 are then clamped at the clamping locations or zones 34 of the flat or flattened sections 33 which are formed at each end contact 3 by flattening or squeezing down the related tube-shaped or tubular end contacts 3 at predetermined portions or regions of these end contacts 3 as shown in FIG. 7. By subsequently appropriately bending or flexing the flat portions or sections 33 there can be produced the solder legs or pins 35 and there is thus obtained the heretofore described construction of fuse device or element 1 as depicted in FIGS. 1 to 4.

It will be readily apparent and thus understood that by bending the flat sections or portions 33 somewhat differently there can be obtained the modified construction of fuse device or element 1A as shown in FIG. 5 and having what has been conveniently termed herein as the Z-shaped soldering legs or pins 35A as opposed to what has been likewise conveniently termed herein as the C-shaped solder legs 35 of the first embodiment of fuse device 1 depicted in FIGS. 1 to 4.

While there are shown and described present preferred embodiments of the invention, it is to be distinctly understood that the invention is not limited thereto, but may be otherwise variously embodied and practiced within the scope of the following claims. ACCORDINGLY,

What we claim is:

1. A fuse device comprising:

an electrically insulating housing;

said electrically insulating housing being internally provided with a continuously extending hollow space;

said hollow space extending along a lengthwise axis and being open at opposite ends thereof;

two electrically conductive end contact means provided for said housing;

each of said electrically conductive end contact means being connected with said electrically insulating housing at the region of an associated one of the open ends of said hollow space;

fusible conductor means arranged approximately concentrically with respect to said lengthwise axis within said hollow space;

said fusible conductor means having opposed end portions;

each of said opposed end portions of said fusible conductor means being electrically conductively secured at a related clamping location at an associated one of said two electrically conductive end contact means;

each of both electrically conductive end contact means engaging by means of an associated substantially tubular portion into the interior of an associated end of the hollow space;

each of said electrically conductive end contact means comprising said substantially tubular portion followed by a flat portion defining said clamping location for the associated end portion of the fusible conductor means;

each of said flat portions defining a connection leg arranged adjacent the clamping location of said flat portion; and said connection leg of each electrically conductive end contact means extending away from said lengthwise axis towards the same side of said hollow space.

2. The fuse device as defined in claim 1, wherein:
each said connection leg defines a solder leg.

3. The fuse device as defined in claim 1, wherein:
said fuse device is structured to define a surface mountable fuse device.

4. The fuse device as defined in claim 1, wherein:
each of said flat portions has a part which initially extends in the direction of the lengthwise axis towards the outside and away from the associated tubular portion.

5. The fuse device as defined in claim 2, wherein:
each of said flat portions comprises at the associated solder leg a solder portion extending approximately parallel to said lengthwise axis;

each said approximately parallel solder portion of the associated solder leg being disposed at a location following a bent region of the associated flat portion and which extends away from said lengthwise axis;

each said solder portion being arranged at an underside of the electrically insulating housing such that each said solder leg protrudes in a direction transverse to said lengthwise axis in relation to said underside of the housing; and said underside of said housing confronting a print upon soldering of the fuse device to said print.

6. The fuse device as defined in claim 5, wherein:
said electrically insulating housing is provided at the underside thereof with recess means for receiving said solder portions.

7. The fuse device as defined in claim 2, wherein:
each of said solder legs comprises a solder portion extending approximately parallel to said lengthwise axis;

each said approximately parallel solder portion of the associated solder leg of each flat portion being disposed at a location of each said flat portion following a bent region of the associated flat portion and which extends away from said lengthwise axis;

each said solder leg being directed away from said housing;

said housing having an underside;

each said solder leg protruding outwardly in relation to said underside of said housing and extending transversely with respect to said lengthwise axis; and said underside of said housing confronting a print when the fuse device is soldered to said print.

8. The fuse device as defined in claim 1, wherein:
said hollow space includes an intermediate region;

each of the open ends of the hollow space being enlarged with respect to said intermediate region of said hollow space by an amount such that each of the tubular portions inserted into the associated open end of the hollow space internally aligns with said intermediate region of said hollow space.

9. The fuse device as defined in claim 1, wherein:
both of said electrically conductive end contact means tightly seal the hollow space of said housing with respect to an arc-extinguishing granular material contained therein.

10. A fuse device comprising:
an electrically insulating housing;

said electrically insulating housing being internally provided with a hollow space;

said hollow space extending along a lengthwise axis and being open at opposite ends thereof;

two electrically conductive end contact means provided for said housing;

each of said electrically conductive end contact means being arranged at said electrically insulating housing at the region of one of the open ends of said hollow space;

fusible conductor means arranged within said hollow space;

said fusible conductor means having opposed end portions;

each of said opposed end portions of said fusible conductor means being electrically conductively secured at a related clamping location at an associated one of said two electrically conducted end contact means;

each of both electrically conductive end contact means engaging by means of an associated portion into the interior of an associated end of the hollow space;

each of said electrically conductive end contact means comprising a flat portion defining said clamping location for the associated end portion of the fusible conductor and arranged adjacent said portion of said electrically conductive end contact means engaging into the interior of the associated end of the hollow space;

each of said flat portions defining a connection leg arranged adjacent the clamping location of said flat portion; and said connection leg of each electrically conductive end contact means extending away from said lengthwise axis towards the same side of said hollow space.

11. A method of fabricating a fuse device, comprising the steps of:
providing a housing internally containing a hollow space;

providing two end contacts;

each of said two end contacts initially being substantially tubular-shaped;

each of said tubular-shaped end contacts being disposed at a tubular portion thereof in a related end of said hollow space and extending substantially coaxially with respect to a lengthwise axis of said hollow space;

inserting a fusible conductor into the hollow space and into the end contacts which are still of substantially tubular-shape;

pressing flat a portion of each substantially tubular-shaped end contact to form at each end contact an associated flat portion, so that an end portion of said fusible conductor is clamped at a clamping location formed at each said flat portion; and bending at least a part of the flat portion of each end contact away from the lengthwise axis of the hollow space in order to form solder legs.

12. A method of fabricating a fuse device, comprising the steps of:

providing a housing internally containing a hollow space;

providing two end contacts each of which is initially of a predetermined geometric shape;

each of said end contacts being disposed at a predetermined portion thereof in a related end of said hollow space and extending substantially coaxially with respect to a lengthwise axis of said hollow space;

inserting a fusible conductor into the hollow space and through the end contacts which are still of said predetermined geometric shape;

flattening a portion of each end contact to form at each end contact an associated flat portion, so that an end portion of said fusible conductor is clamped at a clamping location formed at each said flat portion; and bending at least a part of the flat portion of each end contact away from the lengthwise axis of the hollow space in order to form connection pins.

* * * * *

UNITED STATES PATENT AND TRADEMARK OFFICE
CERTIFICATE OF CORRECTION

PATENT NO. : 4,851,806

DATED : July 25, 1989

INVENTOR(S) : HEINRICH ROHRER et al

It is certified that error appears in the above-identified patent and that said Letters Patent is hereby corrected as shown below:

Column 1, line 32, after "possess" insert --exceedingly small--

Column 1, line 33, please delete "ex-"

Column 1, line 34, please delete "ceedingly small"

Column 3, line 66, after "member," please delete "Then" and insert --then--

Column 4, line 52, please delete "tubuler" and insert --tubular--

Signed and Sealed this

Twenty-second Day of May, 1990

Attest:

HARRY F. MANBECK, JR.

*Attesting Officer*    Commissioner of Patents and Trademarks